(12) United States Patent
Morinaga et al.

(10) Patent No.: US 10,243,477 B2
(45) Date of Patent: Mar. 26, 2019

(54) SEMICONDUCTOR DEVICE HAVING A BYPASS CAPACITOR

(71) Applicant: SHINDENGEN ELECTRIC MANUFACTURING CO., LTD., Chiyoda-ku (JP)

(72) Inventors: Yuji Morinaga, Hanno (JP); Atsushi Kyutoku, Hanno (JP); Yoshihiko Kikuchi, Hanno (JP)

(73) Assignee: SHINDENGEN ELECTRIC MANUFACTURING CO., LTD., Chiyoda-ku (JP)

(*) Notice: Subject to any disclaimer, the term of this patent is extended or adjusted under 35 U.S.C. 154(b) by 0 days.

(21) Appl. No.: 15/738,391

(22) PCT Filed: Jun. 19, 2017

(86) PCT No.: PCT/JP2017/022564
§ 371 (c)(1),
(2) Date: Dec. 20, 2017

(65) Prior Publication Data
US 2018/0367054 A1 Dec. 20, 2018

(51) Int. Cl.
*H01L 27/12* (2006.01)
*H02M 7/00* (2006.01)
(Continued)

(52) U.S. Cl.
CPC .......... *H02M 7/003* (2013.01); *H01L 25/072* (2013.01); *H01L 29/2003* (2013.01); *H01L 29/66462* (2013.01); *H01L 29/778* (2013.01)

(58) Field of Classification Search
CPC .......... H01L 29/2003; H01L 29/66462; H01L 29/778; H01L 25/072
(Continued)

(56) References Cited

U.S. PATENT DOCUMENTS 6,501,172 B1 12/2002 Fukada et al.
2002/0179949 A1* 12/2002 Sakao ............... H01L 27/10894
257/296

(Continued)

FOREIGN PATENT DOCUMENTS

JP 62-150871 A 7/1987
JP 2001-332679 A 11/2001
(Continued)

OTHER PUBLICATIONS

International Search Report dated Aug. 29, 2017, in PCT/JP2017/022564, filed Jun. 19, 2017.

*Primary Examiner* — Yemane Mehari
(74) *Attorney, Agent, or Firm* — Oblon, McClelland, Maier & Neustadt, L.L.P.

(57) ABSTRACT

A semiconductor device 1 of an embodiment is provided, including an insulating substrate 2, conductive pattern parts 51, 52, 53, 54, and 55 formed on the insulating substrate, semiconductor switching parts 10 and 20, and a bypass capacitor 80, the semiconductor switching part 10 provided on the conductive pattern part 51, the semiconductor switching part 20 provided on the conductive pattern part 52, the semiconductor switching part 10 having a side S1 and a side S2, the semiconductor switching part 20 having a side S3 and a side S4, an imaginary line L1 extending along the side S1 and an imaginary line L2 extending along the side S3 intersecting each other.

13 Claims, 4 Drawing Sheets

(51) Int. Cl.
*H01L 25/07* (2006.01)
*H01L 29/778* (2006.01)
*H01L 29/66* (2006.01)
*H01L 29/20* (2006.01)

(58) Field of Classification Search
USPC .................. 363/131, 132; 257/59, 296, 741; 438/238, 330
See application file for complete search history.

(56) References Cited

U.S. PATENT DOCUMENTS

| | | | |
|---|---|---|---|
| 2002/0186545 A1* | 12/2002 | Fukada | ................. H01L 23/473 |
| | | | 361/719 |
| 2002/0188545 A1 | 12/2002 | Fukada et al. | |
| 2011/0148337 A1 | 6/2011 | Yamada | |
| 2014/0231926 A1* | 8/2014 | Okumura | ................. H01L 25/04 |
| | | | 257/401 |
| 2014/0231928 A1 | 8/2014 | Okumura | |
| 2015/0108664 A1 | 4/2015 | Okumura | |
| 2017/0148710 A1* | 5/2017 | Steigler | ............. H01L 23/49575 |
| 2018/0061839 A1* | 3/2018 | Baars | ................ H01L 21/28518 |
| 2018/0190636 A1* | 7/2018 | Mukunoki | .......... H01L 23/5386 |

FOREIGN PATENT DOCUMENTS

| | | |
|---|---|---|
| JP | 2009-88466 A | 4/2009 |
| JP | 2011-243808 A | 12/2011 |
| JP | 2016-162773 A | 9/2016 |
| WO | 2013/046824 A1 | 4/2013 |
| WO | 2015/040727 A1 | 3/2015 |

\* cited by examiner

SEMICONDUCTOR DEVICE HAVING A BYPASS CAPACITOR

TECHNICAL FIELD

The present invention relates to a semiconductor device having a power supply circuit.

BACKGROUND ART

There are known semiconductor devices having power supply circuits which convert a power supply voltage into a desired voltage and output the voltage. Such power supply circuits are an inverter, a rectifier, a DC/DC converter and the like. Such semiconductor devices are used, for example, for a power conditioner of a solar power generation system, a server device, and the like. For the power supply circuit in the semiconductor device, a half bridge circuit or a full bridge circuit is used. Each of these circuits has a structure in which a high-side switch on a high voltage side and a low-side switch on a low voltage side are in cascade connection.

Notably, Patent Literature 1 discloses a power module having two switching elements in cascade connection. In this power module, the high-side switch and the low-side switch are in a parallel arrangement.

CITATION LIST

Patent Literature

Patent Literature 1: Japanese Patent Laid-Open No. 2016-162773

SUMMARY OF INVENTION

Technical Problem

Now, in the power supply circuit, a bypass capacitor is used for removing fluctuation in power supply voltage and various kinds of noise. The bypass capacitor is provided between a high voltage-side terminal and a low voltage-side terminal (ground). Conventionally, the bypass capacitor has been attached to the outside of a semiconductor device. The bypass capacitor is desirably provided inside the semiconductor device (built-in scheme) since such a bypass capacitor is more effective in the case of being disposed near the switching elements.

In the case of employing the built-in scheme, when the high-side switch and the low-side switch are N-type, the bypass capacitor is to be disposed between the source electrode of the high-side switch and the drain electrode of the low-side switch. Notably, when the high-side switch and the low-side switch are P-type, the bypass capacitor is disposed between the drain electrode of the high-side switch and the source electrode of the low-side switch.

However, in the case of a conventional layout in which the high-side switch and the low-side switch are in a parallel arrangement, the length of a path from the high-side switch to the low-side switch via the bypass capacitor (hereinafter, also referred simply as "bypass capacitor path") is long, which increases a parasitic inductance in the bypass capacitor path. This has been being problematically resulting in a concern that the power supply circuit malfunctions.

Therefore, an object of the present invention is to provide a semiconductor device, having a bypass capacitor and a power supply circuit, capable of preventing the power supply circuit from malfunctioning.

Solution to Problem

There is provided a semiconductor device according to the present invention, including:
an insulating substrate;
a first conductive pattern part formed on the insulating substrate;
a second conductive pattern part formed on the insulating substrate;
a third conductive pattern part formed on the insulating substrate;
a fourth conductive pattern part formed on the insulating substrate;
a fifth conductive pattern part formed on the insulating substrate;
a first semiconductor switching part having a first main electrode and a second main electrode and disposed on the first conductive pattern part;
a second semiconductor switching part having a third main electrode and a fourth main electrode and disposed on the second conductive pattern part; and
a bypass capacitor having a first electrode and a second electrode,
the first main electrode of the first semiconductor switching part being electrically connected to the third conductive pattern part, the second main electrode of the first semiconductor switching part being electrically connected to the fourth conductive pattern part, the third main electrode of the second semiconductor switching part being electrically connected to the fourth conductive pattern part, the fourth main electrode of the second semiconductor switching part being electrically connected to the fifth conductive pattern part, the first electrode of the bypass capacitor being electrically connected to the third conductive pattern part, the second electrode of the bypass capacitor being electrically connected to the fifth conductive pattern part,
the first semiconductor switching part having a first side and a second side opposite to the first side, the second semiconductor switching part having a third side and a fourth side opposite to the third side,
the first main electrode being provided along the first side, the second main electrode being provided along the second side, the third main electrode being provided along the third side, the fourth main electrode being provided along the fourth side,
a first imaginary line extending along the first side and a second imaginary line extending along the third side intersecting each other.

Moreover, in the semiconductor device, an angle at which the first imaginary line and the second imaginary line intersect each other may be not less than 30° and not more than 135°.

Moreover, in the semiconductor device, an angle at which the first imaginary line and the second imaginary line intersect each other may be not less than 45° and not more than 90°.

Moreover, in the semiconductor device, an angle at which the first imaginary line and the second imaginary line intersect each other may be 45°.

Moreover, in the semiconductor device, the first main electrode of the first semiconductor switching part may be electrically connected to a high voltage-side terminal via the third conductive pattern part, and the fourth main electrode of the second semiconductor switching part may be electrically connected to a low voltage-side terminal via the fifth conductive pattern part.

Moreover, in the semiconductor device, the insulating substrate may have a first substrate side from which the high voltage-side terminal and the low voltage-side terminal protrude in plan view, and a second substrate side opposite to the first substrate side, and the first semiconductor switching part may be disposed such that the first imaginary line is parallel to the first substrate side, and the second semiconductor switching part may be disposed such that the second imaginary line is oblique to the first substrate side.

Moreover, in the semiconductor device, the bypass capacitor may be disposed such that a third imaginary line connecting the first electrode and the second electrode intersects the first imaginary line and the second imaginary line.

Moreover, in the semiconductor device, an angle at which the third imaginary line intersects the second imaginary line may be 90°.

Moreover, in the semiconductor device, the first semiconductor switching part may have a first GaN-HEMT disposed on the first conductive pattern part, and a first MOS-FET disposed on the first GaN-HEMT, the second semiconductor switching part may have a second GaN-HEMT disposed on the second conductive pattern part, and a second MOS-FET disposed on the second GaN-HEMT, and a gate electrode of the first GaN-HEMT may be electrically connected to the second main electrode via the fourth conductive pattern part, and a gate electrode of the second GaN-HEMT may be electrically connected to the fourth main electrode via the fifth conductive pattern part.

Moreover, in the semiconductor device, the first GaN-HEMT and the second GaN-HEMT may be normally-on transistors, and the first MOS-FET and the second MOS-FET may be normally-off transistors.

Moreover, in the semiconductor device, the bypass capacitor may be resin-sealed along with the first semiconductor switching part and the second semiconductor switching part.

Moreover, in the semiconductor device, a sixth conductive pattern part formed on the insulating substrate;

a seventh conductive pattern part formed on the insulating substrate;

an eighth conductive pattern part formed on the insulating substrate;

a ninth conductive pattern part formed on the insulating substrate;

a third semiconductor switching part having a fifth main electrode and a sixth main electrode and disposed on the sixth conductive pattern part; and a fourth semiconductor switching part having a seventh main electrode and an eighth main electrode and disposed on the seventh conductive pattern part may be further included, wherein the fifth main electrode of the third semiconductor switching part is electrically connected to the eighth conductive pattern part, the sixth main electrode of the third semiconductor switching part is electrically connected to the ninth conductive pattern part, the seventh main electrode of the fourth semiconductor switching part is electrically connected to the ninth conductive pattern part, and the eighth main electrode of the fourth semiconductor switching part is electrically connected to the fifth conductive pattern part, and the first semiconductor switching part and the third semiconductor switching part are symmetrically disposed with the fifth conductive pattern part interposed therebetween, and the second semiconductor switching part and the fourth semiconductor switching part are symmetrically disposed with the fifth conductive pattern part interposed therebetween.

Moreover, in the semiconductor device, another bypass capacitor having a third electrode and a fourth electrode may be further included, wherein the third electrode is electrically connected to the eighth conductive pattern part, and the fourth electrode is electrically connected to the fifth conductive pattern part, and the bypass capacitor and the other bypass capacitor are symmetrically disposed with the fifth conductive pattern part interposed therebetween.

Advantageous Effects of Invention

In the semiconductor device according to the present invention, the first semiconductor switching part and the second semiconductor switching part are disposed such that the first imaginary line of the first semiconductor switching part and the second imaginary line of the second semiconductor switching part intersect each other. Thereby, a bypass capacitor path can be made short, and a parasitic inductance in the bypass capacitor path can be suppressed as compared with the case where the first semiconductor switching part and the second semiconductor switching part are in a parallel arrangement.

Therefore, according to the present invention, there can be provided a semiconductor device, having a bypass capacitor and a power supply circuit, capable of preventing the power supply circuit from malfunctioning.

DESCRIPTION OF EMBODIMENTS

Figure 1:
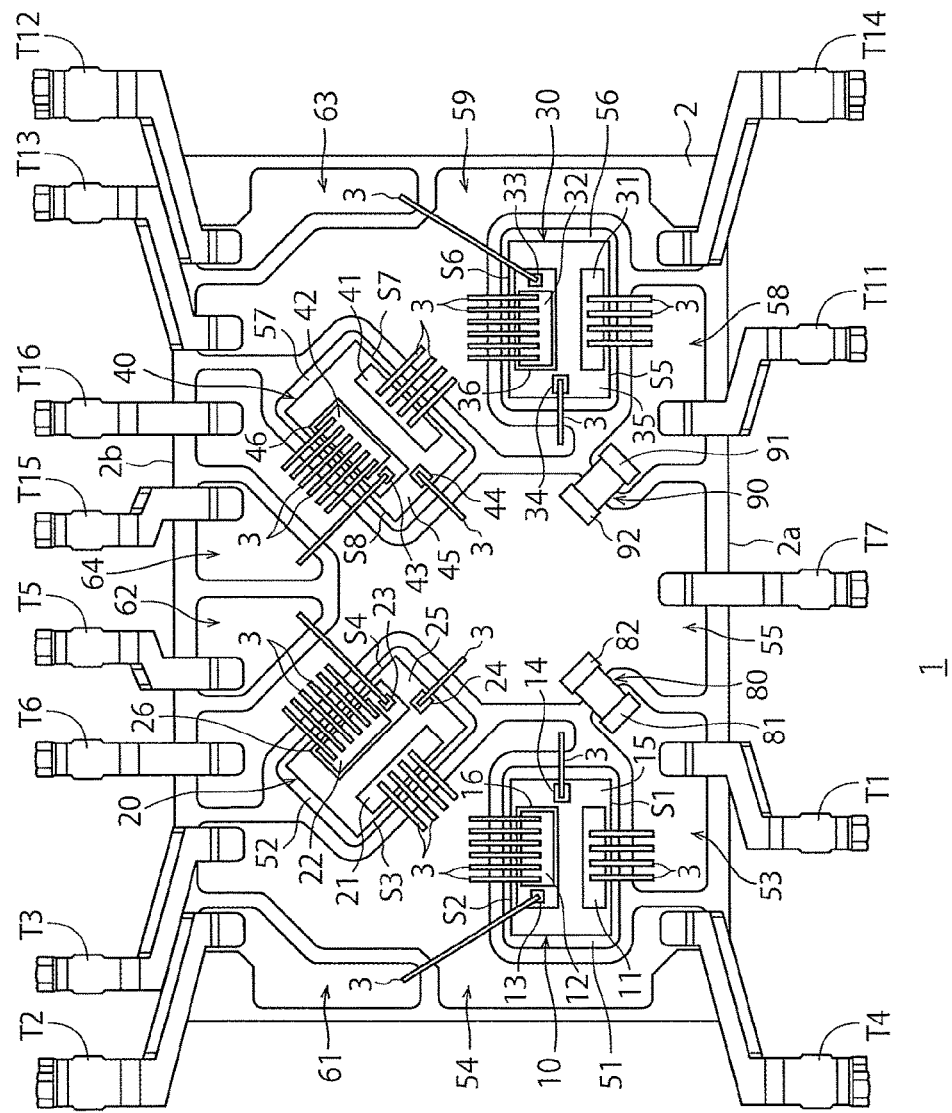
FIG. 1 is a plan view showing an internal configuration of a semiconductor device 1 according to an embodiment of the present invention.

Hereafter, a semiconductor device according to an embodiment of the present invention is described with reference to the drawings. Notably, constituents having the equivalent functions are given the same signs in the drawings.

Figure 3:
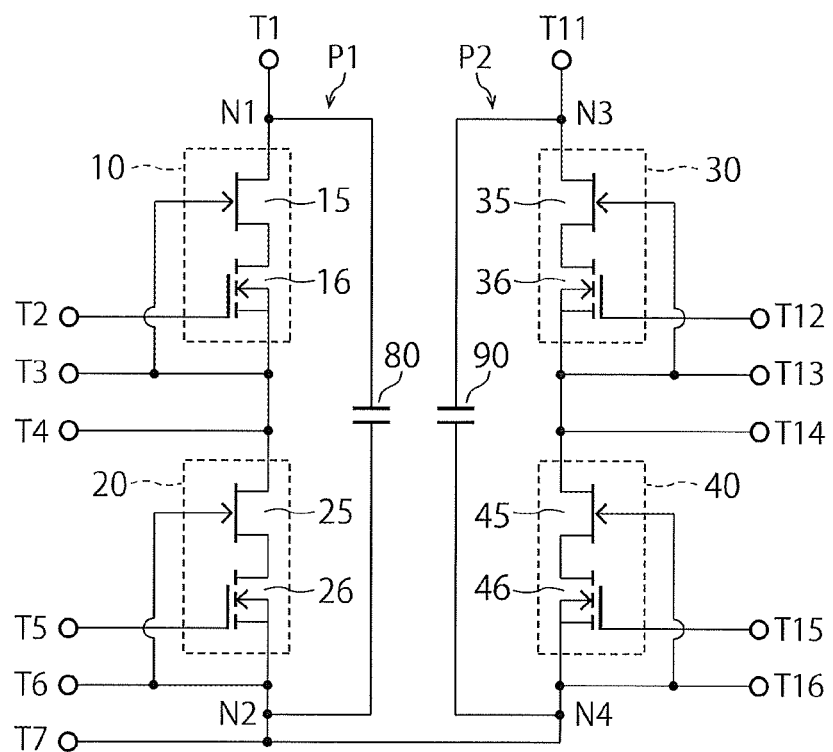
FIG. 3 is a circuit diagram of the semiconductor device 1 according to an embodiment of the present invention.

As shown in a circuit diagram of FIG. 3, a semiconductor device 1 according to an embodiment of the present invention has two half bridge circuits. Namely, the semiconductor device 1 has a first half bridge circuit including a semiconductor switching part 10 and a semiconductor switching part 20, and a second half bridge circuit including a semiconductor switching part 30 and a semiconductor switching part 40. The semiconductor switching parts 10 and 30 are high-side switches, and the semiconductor switching parts 20 and 40 are low-side switches. The semiconductor switching part 10 and the semiconductor switching part 20 are in cascade connection, and the semiconductor switching part 30 and the semiconductor switching part 40 are in cascade connection. The semiconductor device 1 functions, for example, as a DC/DC converter, a rectifier or an inverter.

Figure 2:
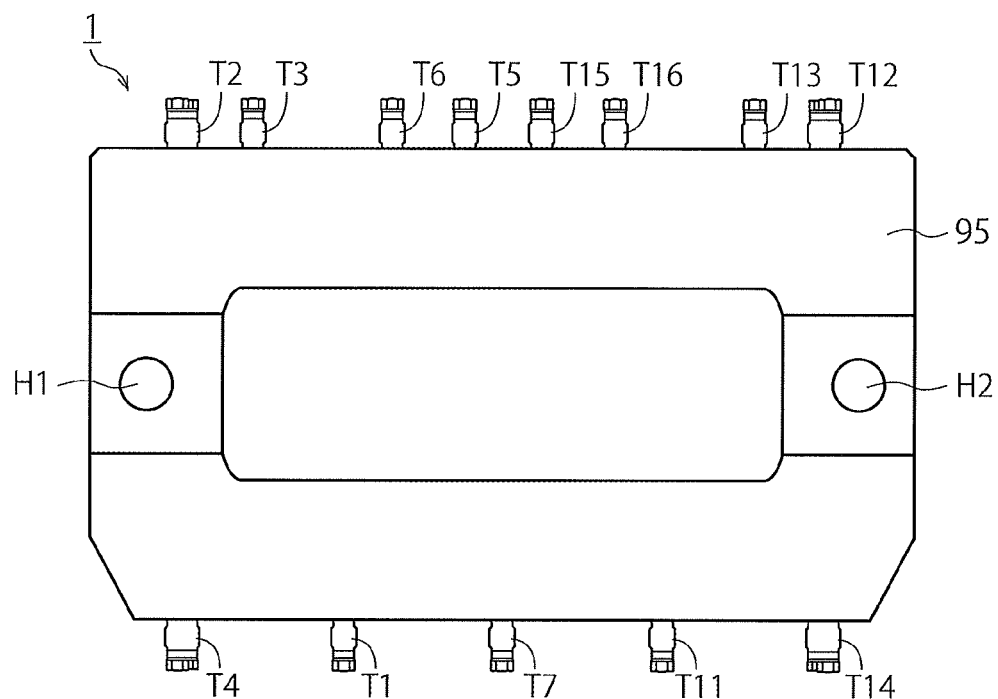
FIG. 2 is a view of an appearance of the semiconductor device 1 according to an embodiment of the present invention.

As shown in FIG. 1 and FIG. 2, the semiconductor device 1 includes an insulating substrate 2, the semiconductor switching part 10 (first semiconductor switching part), the semiconductor switching part 20 (second semiconductor switching part), the semiconductor switching part 30 (third semiconductor switching part), the semiconductor switching part 40 (fourth semiconductor switching part), conductive pattern parts 51, 52, 53, 54, 55, 56, 57, 58, 59, 61, 62, 63 and 64 which are formed on the insulating substrate 2, bypass capacitors 80 and 90, and a resin-sealed part 95.

As shown in FIG. 1, the semiconductor device 1 is configured to be in bilateral symmetry. A first half bridge circuit is formed on one side, and a second half bridge circuit is formed on the other side.

The semiconductor device 1 further includes the terminals T1, T2, T3, T4, T5, T6, T7, T11, T12, T13, T14, T15 and T16 for connection to external devices (IC chips such as a driver, and a power supply). These terminals are provided so as to come and protrude from the planes of FIG. 1 and FIG. 2. Moreover, outer leads of these terminals and portions other than the back surface of the insulating substrate 2 are resin-sealed with the resin-sealed part 95. Notably, as shown in FIG. 2, through holes H1 and H2 for inserting screws therethrough for attaching the semiconductor device 1 to a heat sink or the like are provided in the resin-sealed part 95.

The semiconductor switching part 10 has a main electrode 11 (first main electrode), a main electrode 12 (second main electrode) and a controlling electrode 13. The semiconductor switching part 20 has a main electrode 21 (third main electrode), a main electrode 22 (fourth main electrode) and a controlling electrode 23. The semiconductor switching part 30 has a main electrode 31 (fifth main electrode), a main electrode 32 (sixth main electrode) and a controlling electrode 33. The semiconductor switching part 40 has a main electrode 41 (seventh main electrode), a main electrode 42 (eighth main electrode) and a controlling electrode 43.

The insulating substrate 2 is composed of an insulating material, and preferably composed of a material such as ceramics that is excellent in heat dissipation. As shown in FIG. 1, the insulating substrate 2 has a substrate side 2a (first substrate side) and a substrate side 2b (second substrate side) opposite to the substrate side 2a. The substrate sides 2a and 2b are sides from which terminals protrude in plan view. Namely, terminals T1, T4, T7, T11 and T14 protrude from the substrate side 2a in plan view, and terminals T2, T3, T5, T6, T12, T13, T15 and T16 protrude from the substrate side 2b in plan view. Notably, a conductive pattern (not shown) connected to a radiator such as a heat sink is formed on the back surface of the insulating substrate 2.

The bypass capacitors 80 and 90 are provided for preventing fluctuation in power supply voltage of the semiconductor device 1 and for removing various kinds of noise. The bypass capacitor 80 has an electrode 81 and an electrode 82. The bypass capacitor 90 has an electrode 91 and an electrode 92. The bypass capacitor 80 is provided between the terminal T1 and the terminal T7. The bypass capacitor 90 is provided between the terminal T11 and the terminal T7. The bypass capacitors 80 and 90 are resin-sealed with the resin-sealed part 95 along with the other electronic components on the insulating substrate 2, such as the semiconductor switching parts 10, 20, 30 and 40. Notably, the capacitances of the bypass capacitors 80 and 90 may be set to be values as large as possible, for example, at which the withstand voltages of the relevant bypass capacitors are larger than the withstand voltages of GaN-HEMTs 15, 25, 35 and 45 mentioned later.

As shown in FIG. 3, in the semiconductor device 1, there exists a path from a node N1 to a node N2 via the bypass capacitor 80 (bypass capacitor path P1). More in detail, the bypass capacitor path P1 is a path from the main electrode 11 of the semiconductor switching part 10 to the main electrode 22 of the semiconductor switching part 20 via the conductive pattern part 53, the bypass capacitor 80 and the conductive pattern part 55.

Likewise, there exists a path from a node N3 to a node N4 via the bypass capacitor 90 (bypass capacitor path P2). More in detail, the bypass capacitor path P2 is a path from the main electrode 31 of the semiconductor switching part 30 to the main electrode 42 of the semiconductor switching part 40 via the conductive pattern part 58, the bypass capacitor 90 and the conductive pattern part 55.

Next, the individual terminals of the semiconductor device 1 are described.

The terminals T1 and T11 are terminals connected to the high voltage side of a power supply (not shown) (high voltage-side terminals). Meanwhile, the terminal T7 is a terminal connected to the low voltage side (ground) of the power supply (low voltage-side terminal). Notably, when the power supply circuit of the semiconductor devices 1 functions as a rectifier, the terminal T1 and the terminal T11 are connected to a load on the output side.

The terminals T2 and T12 are terminals for inputting control signals to high-side switches (in the present embodiment, the semiconductor switching parts 10 and 30) of the half bridge circuits therethrough. The terminals T5 and T15 are terminals for inputting control signals to low-side switches (in the present embodiment, the semiconductor switching parts 20 and 40) of the half bridge circuits therethrough. These terminals T2, T5, T12 and T15 are electrically connected to a driver (not shown) driving the power supply circuit.

The terminal T3 is a terminal for monitoring a voltage between the semiconductor switching part 10 and the semiconductor switching part 20. Likewise, the terminal T13 is a terminal for monitoring a voltage between the semiconductor switching part 30 and the semiconductor switching part 40.

The terminal T4 is a terminal for outputting an output voltage of the first half bridge circuit constituted of the semiconductor switching parts 10 and 20 therethrough. Likewise, the terminal T14 is a terminal for outputting an output voltage of the second half bridge circuit constituted of the semiconductor switching parts 30 and 40 therethrough. Notably, when the power supply circuit of the semiconductor device 1 functions as a rectifier, an AC power supply on the input side is connected between the terminal T4 and the terminal T14.

The terminal T6 is a terminal for monitoring a voltage between the semiconductor switching part 20 and the terminal T7. Likewise, the terminal T16 is a terminal for monitoring a voltage between the semiconductor switching part 40 and the terminal T7.

Next, referring to FIG. 1, the individual conductive pattern parts of the semiconductor device 1 are described in detail.

The conductive pattern parts 51 to 59 and 61 to 64 are formed, for example, by patterning the insulating substrate 2 with a copper foil. The conductive pattern parts 51, 52, 53, 54, 55, 61 and 62 are conductive pattern parts for constituting the first half bridge circuit having the semiconductor switching part 10 and 20. The conductive pattern parts 55, 56, 57, 58, 59, 63 and 64 are conductive pattern parts for constituting the second half bridge circuit having the semiconductor switching part 30 and 40. The conductive pattern part 55 is shared by the first half bridge circuit and the second half bridge circuit.

The conductive pattern part 51 (first conductive pattern part) is a conductive pattern part for implementing the semiconductor switching part 10. Likewise, the conductive pattern part 52 (second conductive pattern part) is a conductive pattern part for implementing the semiconductor switching part 20. The conductive pattern part 56 (sixth conductive pattern part) is a conductive pattern part for implementing the semiconductor switching part 30. The conductive pattern part 57 (seventh conductive pattern part) is a conductive pattern part for implementing the semiconductor switching part 40.

In the present embodiment, the conductive pattern parts 51, 52, 56 and 57 are formed to be substantially quadrangular in plan view to meet the shapes of the semiconductor switching part 10, 20, 30 and 40. As shown in FIG. 1, the semiconductor switching part 10 is disposed on the conductive pattern part 51. The semiconductor switching part 20 is disposed on the conductive pattern part 52. The semiconductor switching part 30 is disposed on the conductive pattern part 56. The semiconductor switching part 40 is disposed on the conductive pattern part 57.

To the conductive pattern part 53 (third conductive pattern part), the main electrode 11 of the semiconductor switching part 10 is electrically connected via the metal wire 3, and the terminal T1 and the electrode 81 of the bypass capacitor 80 are connected via solder. Likewise, to the conductive pattern part 58 (eighth conductive pattern part), the main electrode 31 of the semiconductor switching part 30 is electrically connected via the metal wire 3, and the terminal T11 and the electrode 91 of the bypass capacitor 90 are connected via solder. Notably, while the metal wires 3 are aluminum wires (Al wires) in the present embodiment, they may be composed of another metal material.

The conductive pattern part 54 (fourth conductive pattern part) electrically connects the semiconductor switching part 10 and the semiconductor switching part 20 together. Namely, to the conductive pattern part 54, the main electrode 12 of the semiconductor switching part 10 and the main electrode 21 of the semiconductor switching part 20 are electrically connected via the metal wires 3. Moreover, to the conductive pattern part 54, the terminals T3 and T4 are electrically connected via solder.

Likewise, the conductive pattern part 59 (ninth conductive pattern part) electrically connects the semiconductor switching part 30 and the semiconductor switching part 40 together. Namely, to the conductive pattern part 59, the main electrode 32 of the semiconductor switching part 30 and the main electrode 41 of the semiconductor switching part 40 are electrically connected via the metal wires 3. Moreover, to the conductive pattern part 59, the terminal T13 and the terminal T14 are electrically connected via solder.

The conductive pattern part 55 (fifth conductive pattern part) is shared by the two half bridge circuits included in the semiconductor device 1. Moreover, as shown in FIG. 1, the conductive pattern part 55 is formed to have a shape in bilateral symmetry. The electrode 82 of the bypass capacitor 80 is electrically connected to the conductive pattern part 55 via solder, and the main electrode 22 of the semiconductor switching part 20 is electrically connected thereto via the metal wire 3. Furthermore, the electrode 92 of the bypass capacitor 90 is electrically connected to the conductive pattern part 55 via solder, and the main electrode 42 of the semiconductor switching part 40 is electrically connected thereto via the metal wires 3.

Furthermore, as shown in FIG. 1, to the conductive pattern part 55, the gate electrode 24 of the GaN-HEMT 25 and the gate electrode 44 of the GaN-HEMT 45 are electrically connected via the metal wires 3. Moreover, the terminals T6, T7 and T16 are electrically connected to the conductive pattern part 55 via solder.

The conductive pattern part 61 is a conductive pattern part for electrically connecting the controlling electrode 13 of the semiconductor switching part 10 and the terminal T2 together. To this conductive pattern part 61, the controlling electrode 13 is electrically connected via the metal wire 3, and the terminal T2 is electrically connected via solder. Likewise, the conductive pattern part 63 is a conductive pattern part for electrically connecting the controlling electrode 33 of the semiconductor switching part 30 and the terminal T12 together. To this conductive pattern part 63, the controlling electrode 33 is electrically connected via the metal wire 3, and the terminal T12 is electrically connected via solder.

The conductive pattern part 62 is a conductive pattern part for electrically connecting the controlling electrode 23 of the semiconductor switching part 20 and the terminal T5 together. To this conductive pattern part 62, the controlling electrode 23 is electrically connected via the metal wire 3, and the terminal T5 is electrically connected via solder. Likewise, the conductive pattern part 64 is a conductive pattern part for electrically connecting the controlling electrode 43 of the semiconductor switching part 40 and the terminal T15 together. To this conductive pattern part 64, the controlling electrode 43 is electrically connected via the metal wire 3, and the terminal T15 is electrically connected via solder.

Notably, for electrically connecting the semiconductor switching parts and the conductive pattern parts together, in place of the metal wires, connectors composed of conductive plate materials may be used.

Next, detailed configurations of the individual semiconductor switching parts of the semiconductor device 1 are described.

Each of the semiconductor switching parts 10, 20, 30 and 40 has a GaN-HEMT and a MOS-FET. More in detail, the semiconductor switching part 10 has the GaN-HEMT 15 disposed on the conductive pattern part 51, and a MOS-FET 16 disposed on the GaN-HEMT 15. Likewise, the semiconductor switching part 20 has the GaN-HEMT 25 disposed on the conductive pattern part 52, and a MOS-FET 26 disposed on the GaN-HEMT 25. The semiconductor switching part 30 has the GaN-HEMT 35 disposed on the conductive pattern part 56, and a MOS-FET 36 disposed on the GaN-HEMT 35. The semiconductor switching part 40 has the GaN-HEMT 45 disposed on the conductive pattern part 57, and a MOS-FET 46 disposed on the GaN-HEMT 45.

The GaN-HEMTs 15, 25, 35 and 45 are high electron mobility transistors (High Electron Mobility Transistors: HEMTs) as whose semiconductor material gallium nitride (GaN) is used. All the GaN-HEMTs 15, 25, 35 and 45 are (so-called normally-on) transistors in each of which a channel exists even when a gate voltage is 0 V and a current flows therethrough. Moreover, all the GaN-HEMTs 15, 25, 35 and 45 are N-type. The GaN-HEMTs 15, 25, 35 and 45 are devices each having a lateral structure, and on the upper face of each of them, a source electrode, a drain electrode and a gate electrode are provided.

The MOS-FETs 16, 26, 36 and 46 are field effect transistors (Field Effect Transistors: FETs) each having a MOS (Metal Oxide Semiconductor) structure. All the MOS-FETs 16, 26, 36 and 46 are so-called normally-off transistors. Moreover, all the MOS-FETs 16, 26, 36 and 46 are N-type. The MOS-FETs 16, 26, 36 and 46 are devices each having a vertical structure. A source electrode and a gate electrode are provided on the upper face of each of them, and a drain electrode is provided on the lower face of each of them.

The source electrode provided on the upper face of the GaN-HEMT 15 is electrically connected to the drain electrode provided on the lower face of the MOS-FET 16 via solder. Likewise, the source electrode of the GaN-HEMT 25 is electrically connected to the drain electrode of the MOS-FET 26 via solder. The source electrode of the GaN-HEMT 35 is electrically connected to the drain electrode of the MOS-FET 36 via solder. The source electrode of the GaN-HEMT 45 is electrically connected to the drain electrode of the MOS-FET 46 via solder.

As shown in FIG. 1, a gate electrode 14 of the GaN-HEMT 15 is electrically connected to the main electrode 12 via the conductive pattern part 54. A gate electrode 24 of the GaN-HEMT 25 is electrically connected to the main electrode 22 via the conductive pattern part 55. A gate electrode 34 of the GaN-HEMT 35 is electrically connected to the main electrode 32 via the conductive pattern part 59. A gate electrode 44 of the GaN-HEMT 45 is electrically connected to the main electrode 42 via the conductive pattern part 55.

In the present embodiment, the main electrode 11 of the semiconductor switching part 10 is the drain electrode of the GaN-HEMT 15. The main electrode 12 thereof is the source electrode of the MOS-FET 16. The controlling electrode 13 thereof is the gate electrode of the MOS-FET 16. The main electrode 11 is electrically connected to the conductive pattern part 53, and the main electrode 12 is electrically connected to the conductive pattern part 54. The main electrode 11 is electrically connected to the high voltage-side terminal (terminal T1) via the conductive pattern part 53. The controlling electrode 13 is electrically connected to the conductive pattern part 61.

The main electrode 21 of the semiconductor switching part 20 is the drain electrode of the GaN-HEMT 25. The main electrode 22 thereof is the source electrode of the MOS-FET 26. The controlling electrode 23 thereof is the gate electrode of the MOS-FET 26. The main electrode 21 is electrically connected to the conductive pattern part 54, and the main electrode 22 is electrically connected to the conductive pattern part 55. This main electrode 22 is electrically connected to the low voltage-side terminal (terminal T7) via the conductive pattern part 55. The controlling electrode 23 is electrically connected to the conductive pattern part 62.

The main electrode 31 of the semiconductor switching part 30 is the drain electrode of the GaN-HEMT 35. The main electrode 32 thereof is the source electrode of the MOS-FET 36. The controlling electrode 33 thereof is the gate electrode of the MOS-FET 36. The main electrode 31 is electrically connected to the conductive pattern part 58, and the main electrode 32 is electrically connected to the conductive pattern part 59. The main electrode 31 is electrically connected to the high voltage-side terminal (terminal T11) via the conductive pattern part 58. The controlling electrode 33 is electrically connected to the conductive pattern part 63.

The main electrode 41 of the semiconductor switching part 40 is the drain electrode of the GaN-HEMT 45. The main electrode 42 thereof is the source electrode of the MOS-FET 46. The controlling electrode 43 thereof is the gate electrode of the MOS-FET 46. The main electrode 41 is electrically connected to the conductive pattern part 59, and the main electrode 42 is electrically connected to the conductive pattern part 55. The main electrode 42 is electrically connected to the low voltage-side terminal (terminal T7) via the conductive pattern part 55. The controlling electrode 43 is electrically connected to the conductive pattern part 64.

Notably, the configurations of the semiconductor switching parts 10, 20, 30 and 40 are not limited to the above ones. For example, each of the semiconductor switching parts 10, 20, 30 and 40 may be constituted of one semiconductor switching element (normally-off GaN-HEMT, MOS-FET or the like).

Moreover, the GaN-HEMTs 15, 25, 35 and 45 may have vertical structures. In this case, exemplarily stated for the semiconductor switching part 10, the drain electrode provided on the back surface of the GaN-HEMT 15 is connected to the conductive pattern part 51 via solder. The conductive pattern part 51 and the conductive pattern part 53 are joined together to be configured as an integrated conductive pattern part. Likewise also in the case of the GaN-HEMT 25, the drain electrode provided on the back surface of the GaN-HEMT 25 is connected to the conductive pattern part 52 via solder. The conductive pattern part 52 and the conductive pattern part 55 are joined together. Notably, the similar connection to this is employed also in the case where the semiconductor switching part is constituted of only a MOS-FET having a vertical structure.

As shown in FIG. 1, the bypass capacitor 80 is provided between the drain electrode of the GaN-HEMT 15 and the source electrode of the MOS-FET 26. The bypass capacitor 90 is provided between the drain electrode of the GaN-HEMT 35 and the source electrode of the MOS-FET 46.

Next, arrangement relation between the high-side switch and the low-side switch in the present embodiment is described. Herein, referring to FIG. 4, the semiconductor switching part 10 and the semiconductor switching part 20 are described.

Figure 4:
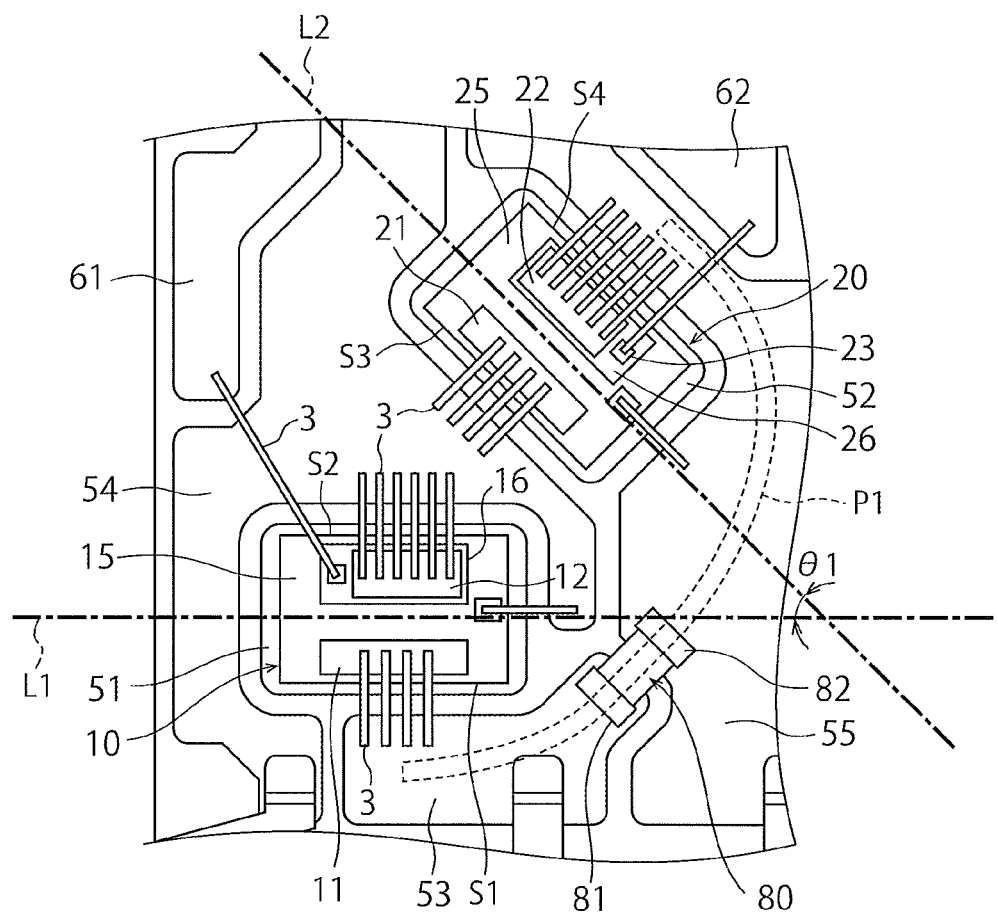
FIG. 4 is an expanded plan view for explaining imaginary lines L1 and L2.

As shown in FIG. 4, the semiconductor switching parts 10 and 20 are substantially quadrangular in plan view. The semiconductor switching part 10 has a side S1 (first side) and a side S2 (second side) opposite to this side S1. In the present embodiment, the side S1 and the side S2 are substantially parallel to each other. Likewise, the semiconductor switching part 20 has a side S3 (third side) and a side S4 (fourth side) opposite to this side S3. In the present embodiment, the side S3 and the side S4 are substantially parallel to each other.

The main electrode 11 of the semiconductor switching part 10 is provided along the side S1. The main electrode 12 thereof is provided along the side S2. The main electrode 21 of the semiconductor switching part 20 is provided along the side S3. The main electrode 22 thereof is provided along the side S4.

As shown in FIG. 4, in the semiconductor device 1, an imaginary line L1 extending along the side S1 (or the side S2) and an imaginary line L2 extending along the side S3 (or the side S4) intersect each other. In other words, the imaginary line L1 and the imaginary line L2 are not parallel to each other. Thereby, as compared with the case where the semiconductor switching part 10 and the semiconductor switching part 20 are in parallel arrangement (that is, the case where the imaginary line L1 and the imaginary line L2 are parallel to each other), the bypass capacitor path P1 can be made short. For this reason, a parasitic inductance in the bypass capacitor path P1 can be suppressed. Therefore, according to the present embodiment, a malfunction of a power supply circuit can be prevented.

Notably, as an angle θ1 at which the imaginary line L1 and the imaginary line L2 intersect each other is larger, the length of the bypass capacitor path P1 is shorter, which suppresses the parasitic inductance more. However, this meanwhile causes the length of a path between the semiconductor switching part 10 (specifically, the source electrode of the MOS-FET 16) and the semiconductor switching part 20 (specifically, the drain electrode of the GaN-HEMT 25) to be longer, and a parasitic inductance in this path becomes larger, which leads to the cause of a malfunction of the power supply circuit. With such circumstances taken into consideration, the angle θ1 is needed not to be too large. Specifically, the angle θ1 is preferably not less than 30° and not more than 135°, still preferably not less than 45° and not more than 90°. In the present embodiment, the angle θ1 is substantially 45°.

As described above, in the semiconductor device 1 according to the present embodiment, the semiconductor switching part 10 and the semiconductor switching part 20 are disposed such that the imaginary line L1 of the semiconductor switching part 10 and the imaginary line L2 of the semiconductor switching part 20 intersect each other. Thereby, a bypass capacitor path can be made short, and a parasitic inductance can be suppressed. Therefore, according to the present embodiment, the power supply circuit having the semiconductor switching parts 10 and 20 can be prevented from malfunctioning.

Figure 5:
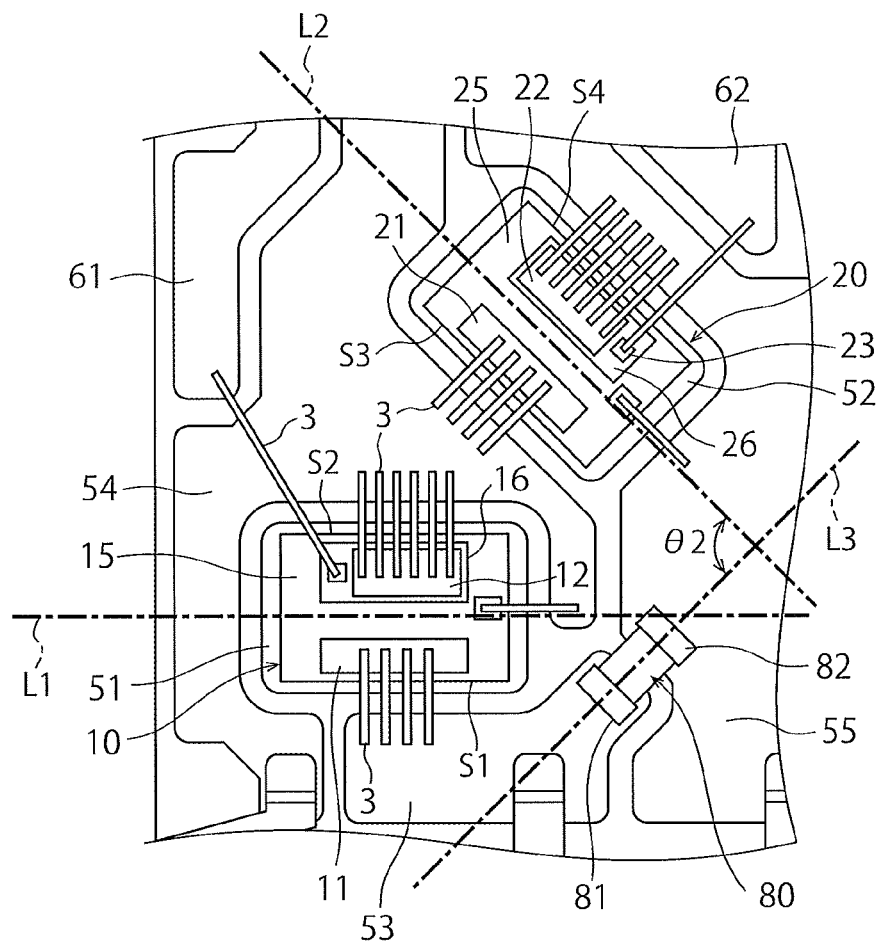
FIG. 5 is an expanded plan view for explaining an imaginary line L3.

Notably, as shown in FIG. 5, the bypass capacitor 80 is disposed such that an imaginary line L3 connecting the electrode 81 and the electrode 82 intersects the imaginary line L1 and the imaginary line L2. Namely, the imaginary line L3 is not parallel to the imaginary line L1 or the imaginary line L2. The bypass capacitor 80 is disposed along the bypass capacitor path P1. Thereby, the bypass capacitor path P1 is made shorter. Therefore, the parasitic inductance in the bypass capacitor path P1 can be further reduced. Notably, in the present embodiment, an angle θ2 at which the imaginary line L3 and the imaginary line L2 intersect each other is substantially 90°.

Moreover, as shown in FIG. 1, the semiconductor switching part 10 which is the high-side switch is disposed such that the imaginary line L1 is substantially parallel to the substrate side 2a. The semiconductor switching part 20 which is the low-side switch is disposed such that the imaginary line L2 is oblique to the substrate side 2a. As a result, a space in an upper center region of the insulating substrate 2 can be easily secured. Thereby, for example, a region where the metal wires 3 connected to the main electrode 22 are connected to the conductive pattern part 55 and which obliquely extends, out of the conductive pattern part 55, can be made wide. Thereby, the parasitic inductance in the bypass capacitor path P1 can be further reduced.

Moreover, as mentioned above, the semiconductor device 1 has a configuration in bilateral symmetry. Namely, as shown in FIG. 1, the semiconductor switching part 10 and the semiconductor switching part 30 are symmetrically disposed with the conductive pattern part 55 interposed therebetween. The semiconductor switching part 20 and the semiconductor switching part 40 are symmetrically disposed with the conductive pattern part 55 interposed therebetween. The bypass capacitor 80 and the bypass capacitor 90 are also symmetrically disposed with the conductive pattern part 55 interposed therebetween. Further, the conductive pattern part 55 is shared by the two half bridge circuits. Such a configuration of the semiconductor device 1 in bilateral symmetry as above enables the conductive pattern part 55 to be wide, and parasitic inductances in the bypass capacitor paths P1 and P2 to be further reduced.

As above, the semiconductor device according to the present embodiment has been described. Notably, not limited to the aforementioned half bridge circuit, the semiconductor device according to the present invention can also be applied to power supply circuits with other configurations, such as a full bridge circuit and a push-pull circuit, as long as each has semiconductor switching elements in cascade connection.

Based on the aforementioned description, while those skilled in the art may conceive of additional effects and various alterations of the present invention, aspects of the present invention are not limited to the aforementioned individual embodiments. Components across different embodiments may be properly combined. Various additions, modifications and partial deletions may occur without departing from the conceptual ideas and spirit of the present invention derived from the contents and their equivalents as defined in the appended claims.

REFERENCE SIGNS LIST

1 Semiconductor device
2 Insulating substrate
2a, 2b Substrate side
3 Metal wire
10, 20, 30, 40 Semiconductor switching part
11, 12, 21, 22, 31, 32, 41, 42 Main electrode
13, 23, 33, 43 Controlling electrode
15, 25, 35, 45 GaN-HEMT
16, 26, 36, 46 MOS-FET
51, 52, 53, 54, 55, 56, 57, 58, 59, 61, 62, 63, 64 Conductive pattern part
80, 90 Bypass capacitor
81, 82, 91, 92 Electrode
95 Resin-sealed part
H1, H2 Through hole
L1, L2, L3 Imaginary line
N1, N2, N3, N4 Node
P1, P2 Bypass capacitor path
S1, S2, S3, S4 Side
T1, T2, T3, T4, T5, T6, T7, T11, T12, T13, T14, T15, T16 Terminal

The invention claimed is:

1. A semiconductor device comprising:
an insulating substrate;
a first conductive pattern part formed on the insulating substrate;
a second conductive pattern part formed on the insulating substrate;
a third conductive pattern part formed on the insulating substrate;
a fourth conductive pattern part formed on the insulating substrate;
a fifth conductive pattern part formed on the insulating substrate;

a first semiconductor switching part having a first main electrode and a second main electrode and disposed on the first conductive pattern part;

a second semiconductor switching part having a third main electrode and a fourth main electrode and disposed on the second conductive pattern part; and a bypass capacitor having a first electrode and a second electrode, the first main electrode of the first semiconductor switching part being electrically connected to the third conductive pattern part, the second main electrode of the first semiconductor switching part being electrically connected to the fourth conductive pattern part, the third main electrode of the second semiconductor switching part being electrically connected to the fourth conductive pattern part, the fourth main electrode of the second semiconductor switching part being electrically connected to the fifth conductive pattern part, the first electrode of the bypass capacitor being electrically connected to the third conductive pattern part, the second electrode of the bypass capacitor being electrically connected to the fifth conductive pattern part, the first semiconductor switching part having a first side and a second side opposite to the first side, the second semiconductor switching part having a third side and a fourth side opposite to the third side, the first main electrode being provided along the first side, the second main electrode being provided along the second side, the third main electrode being provided along the third side, the fourth main electrode being provided along the fourth side, a first imaginary line extending along the first side and a second imaginary line extending along the third side intersecting each other.

2. The semiconductor device according to claim 1, wherein an angle at which the first imaginary line and the second imaginary line intersect each other is not less than 30° and not more than 135°.

3. The semiconductor device according to claim 1, wherein an angle at which the first imaginary line and the second imaginary line intersect each other is not less than 45° and not more than 90°.

4. The semiconductor device according to claim 1, wherein an angle at which the first imaginary line and the second imaginary line intersect each other is 45°.

5. The semiconductor device according to claim 1, wherein the first main electrode of the first semiconductor switching part is electrically connected to a high voltage-side terminal via the third conductive pattern part, and the fourth main electrode of the second semiconductor switching part is electrically connected to a low voltage-side terminal via the fifth conductive pattern part.

6. The semiconductor device according to claim 5, wherein the insulating substrate has a first substrate side from which the high voltage-side terminal and the low voltage-side terminal protrude in plan view, and a second substrate side opposite to the first substrate side, and the first semiconductor switching part is disposed such that the first imaginary line is parallel to the first substrate side, and the second semiconductor switching part is disposed such that the second imaginary line is oblique to the first substrate side.

7. The semiconductor device according to claim 6, wherein the bypass capacitor is disposed such that a third imaginary line connecting the first electrode and the second electrode intersects the first imaginary line and the second imaginary line.

8. The semiconductor device according to claim 7, wherein an angle at which the third imaginary line intersects the second imaginary line is 90°.

9. The semiconductor device according to claim 1, wherein the first semiconductor switching part has
a first GaN-HEMT disposed on the first conductive pattern part, and
a first MOS-FET disposed on the first GaN-HEMT,
the second semiconductor switching part has
a second GaN-HEMT disposed on the second conductive pattern part, and
a second MOS-FET disposed on the second GaN-HEMT, and
a gate electrode of the first GaN-HEMT is electrically connected to the second main electrode via the fourth conductive pattern part, and a gate electrode of the second GaN-HEMT is electrically connected to the fourth main electrode via the fifth conductive pattern part.

10. The semiconductor device according to claim 9, wherein the first GaN-HEMT and the second GaN-HEMT are normally-on transistors, and the first MOS-FET and the second MOS-FET are normally-off transistors.

11. The semiconductor device according to claim 1, wherein the bypass capacitor is resin-sealed along with the first semiconductor switching part and the second semiconductor switching part.

12. The semiconductor device according to claim 1, further comprising:

a sixth conductive pattern part formed on the insulating substrate;
a seventh conductive pattern part formed on the insulating substrate;
an eighth conductive pattern part formed on the insulating substrate;
a ninth conductive pattern part formed on the insulating substrate;
a third semiconductor switching part having a fifth main electrode and a sixth main electrode and disposed on the sixth conductive pattern part; and
a fourth semiconductor switching part having a seventh main electrode and an eighth main electrode and disposed on the seventh conductive pattern part, wherein
the fifth main electrode of the third semiconductor switching part is electrically connected to the eighth conductive pattern part, the sixth main electrode of the third semiconductor switching part is electrically connected to the ninth conductive pattern part, the seventh main electrode of the fourth semiconductor switching part is electrically connected to the ninth conductive pattern part, and the eighth main electrode of the fourth semiconductor switching part is electrically connected to the fifth conductive pattern part, and
the first semiconductor switching part and the third semiconductor switching part are symmetrically disposed with the fifth conductive pattern part interposed therebetween, and the second semiconductor switching part and the fourth semiconductor switching part are symmetrically disposed with the fifth conductive pattern part interposed therebetween.

13. The semiconductor device according to claim 12, further comprising another bypass capacitor having a third electrode and a fourth electrode, wherein the third electrode is electrically connected to the eighth conductive pattern part, and the fourth electrode is electrically connected to the fifth conductive pattern part, and the bypass capacitor and the other bypass capacitor are symmetrically disposed with the fifth conductive pattern part interposed therebetween.

* * * * *

UNITED STATES PATENT AND TRADEMARK OFFICE
CERTIFICATE OF CORRECTION

PATENT NO. : 10,243,477 B2  
APPLICATION NO. : 15/738391  
DATED : March 26, 2019  
INVENTOR(S) : Yuji Morinaga et al.

Page 1 of 1

It is certified that error appears in the above-identified patent and that said Letters Patent is hereby corrected as shown below:

On the Title Page

Item (87), the PCT Publication has been omitted: Item (87) should read:
--(87)  PCT Pub. No.: WO/2018/235135
        PCT Pub. Date: Dec. 27, 2018--

Signed and Sealed this  
Second Day of June, 2020

Andrei Iancu  
*Director of the United States Patent and Trademark Office*